United States Patent [19]
Hirota et al.

[11] Patent Number: 5,858,834
[45] Date of Patent: Jan. 12, 1999

[54] METHOD FOR FORMING CYLINDRICAL CAPACITOR LOWER PLATE IN SEMICONDUCTOR DEVICE

[75] Inventors: Toshiyuki Hirota; Kiyotaka Sakamoto; Shuji Fujiwara, all of Tokyo, Japan

[73] Assignee: NEC Corporation, Tokyo, Japan

[21] Appl. No.: 807,692

[22] Filed: Feb. 28, 1997

[30] Foreign Application Priority Data

Feb. 28, 1996 [JP] Japan ................................ 8-041157

[51] Int. Cl.⁶ .............................................. H01L 21/8242
[52] U.S. Cl. ........................ 438/253; 438/255; 438/398
[58] Field of Search ................................. 438/253, 254, 438/255, 396, 397, 398

[56] References Cited

U.S. PATENT DOCUMENTS

| | | | |
|---|---|---|---|
| 5,284,787 | 2/1994 | Ahn | 438/396 |
| 5,408,114 | 4/1995 | Kinoshita et al. | 257/296 |
| 5,448,512 | 9/1995 | Hachisuka et al. | 365/149 |
| 5,476,807 | 12/1995 | Lee et al. | 438/396 |
| 5,481,127 | 1/1996 | Ogawa | 257/308 |

FOREIGN PATENT DOCUMENTS

| | | |
|---|---|---|
| 4328510 | 3/1994 | Germany . |
| 4423818 | 1/1995 | Germany . |
| 4446983 | 6/1995 | Germany . |
| 5-136371 | 6/1993 | Japan . |
| 6-29463 | 2/1994 | Japan . |

*Primary Examiner*—Tuan H. Nguyen
*Attorney, Agent, or Firm*—Sughrue, Mion, Zinn, Macpeak & Seas, PLLC

[57] ABSTRACT

In a method for forming a cylindrical capacitor lower plate in a semiconductor device, a first insulating film, a first conducting film and a second insulating film are formed on a principal surface of a semiconductor substrate in the named order. A patterned photoresist film is formed on the second insulating film, and the second insulating film is patterned by an anisotropic etching using the photoresist film as a mask. After the photoresist film is removed, the first conducting film is patterned by an etching using the patterned second insulating film as a mask. Thereafter, a second conducting film is deposited on a whole surface, and then, the second conducting film is anisotropically etched so that a remaining second conducting film is left on a side surface of the patterned first conducting film. The patterned second insulating film is removed, so that the remaining second conducting film is left in the form of a sidewall which is upright from a periphery of the patterned first conducting film.

12 Claims, 8 Drawing Sheets

METHOD FOR FORMING CYLINDRICAL CAPACITOR LOWER PLATE IN SEMICONDUCTOR DEVICE

BACKGROUND OF THE INVENTION

1. Field of the invention

The present invention relates to a semiconductor device manufacturing method, and more specifically a method for forming a cylindrical capacitor lower plate in a semiconductor device.

2. Description of Related Art

Of semiconductor memories, a DRAM (dynamic random access memory) is known as a memory possible to freely write and read information. In this DRAM memory, the simplest memory cell consists of one transfer transistor and one capacitor (one transistor type memory cell), and is widely used since it is the most suitable for increasing an integration density of the semiconductor device.

For a capacitor incorporated in this type of memory cell, a three-dimensional structure has been developed and actually used in order to further elevate the integration density of the semiconductor device. The reason for adopting the three-dimensional structure of capacitor, is that, with advanced microminiaturization and elevated integration density of semiconductor device elements, an occupying area of the capacitor is inevitably reduced, but on the other hand, a capacitance not less than a predetermined value is required to ensure a stable and reliable operation of the DRAM. Under this circumstance, by replacing a planar structure of capacitor plates by a three-dimensional structure of capacitor plates, it was attempted to increase an effective area of the of capacitor plates under a reduced occupying area of the capacitor.

The three-dimensional capacitor for the DRAM includes a stacked structure and a trench structure, which have both merits and demerits. The stacked structure is highly resistive to an alpha ray incidence and noises from other circuits, and stably operates with a relatively small capacitance. Therefore, even in a 1-Gbit DRAM manufactured on 0.15 µm rule in the semiconductor device design, the stacked structure capacitor is considered to be effective. However, in a simple stacked capacitor structure, it is predicted that a height of a capacitor plate is required to be larger than about 0.8 µm in a 256 Mbit DRAM and about 1.2 µm in a 1 Gbit DRAM. But, this is not practical, since there exists a strong demand for suppressing the height of the capacitor plate because a wiring disconnection is apt to occur due to a large step difference and because a depth of field is limited in a photolithography.

Under the above mentioned circumstances, as one kind of the stacked structure capacitor, attention is attracted to a structure called a "cylinder type". For example, Japanese Patent Application Laid-open Publication Nos. JP-A-5-136371 and JP-A-6-029463 have proposed to form a capacitor lower plate in the form of a cylinder, for the purpose of increasing a surface area of the capacitor plate.

Now, a prior art process for forming a lower plate of the cylinder type stacked structure capacitor will be described with reference to FIGS. 1A to 1F, which are diagrammatic sectional views for illustrating the prior art process for forming a lower plate of the cylinder type stacked structure capacitor.

Figure 1A:
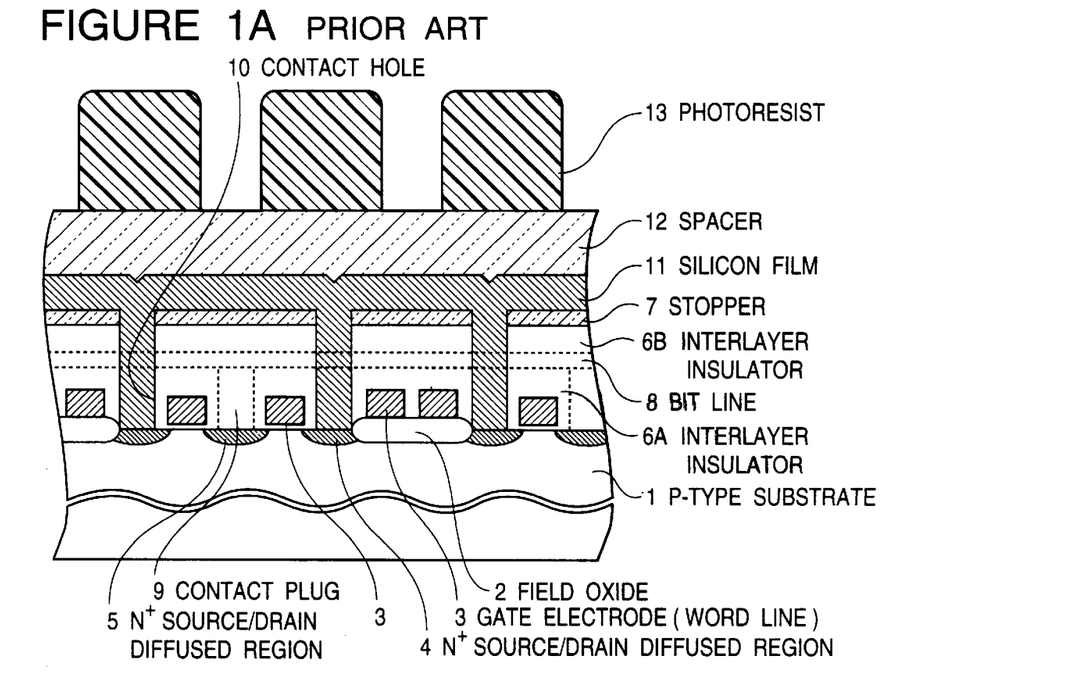
FIGS. 1A to 1F are diagrammatic sectional views of a portion of a semiconductor device, for illustrating the prior art process for forming a lower plate of the cylinder type stacked structure capacitor.

As shown in FIG. 1A, a field oxide film 2 is formed as a device isolation insulating film on a silicon substrate 1 of for example P-type. For each memory cell transistor, a gate electrode 3 (functioning as a word line) of each memory cell transistor is formed through a gate insulator film on a principal surface of the substrate 1, and a pair of $N^+$ source/drain diffused regions 4 and 5 are formed in a principal surface region of the substrate 1. The diffused region 4 is to be connected to a possible capacitor, and the diffused region 5 is to be connected to a bit line. A silicon oxide film is deposited to form an interlayer insulator film 6A covering the gate electrode (word line) 3 and the principal surface of the substrate 1, and a bit line contact plug 9 is formed to penetrate through the interlayer insulator film 6A to reach the diffused region 5 for the bit line. A bit line 8 is formed on the interlayer insulator film 6A and to be electrically connected to the bit line contact plug 9. Furthermore, an interlayer insulator film 6B is also deposited to cover the bit line 8 and the interlayer insulator film 6A.

Thereafter, a stopper film 7 is deposited to cover the interlayer insulator film 6B. This stopper film 7 is formed of for example a silicon nitride film.

Then, a contact hole 10 is formed to penetrate through the stopper film 7 and the interlayer insulator films 6A and 6B to reach the diffused region 4 for the possible capacitor, and a first silicon film 11 is deposited by a known CVD (chemical vapor deposition) process to fill the contact hole 10 and to cover the stopper film 7. This first silicon film 11 forms a portion of a storage plate (lower plate) of the possible capacitor. Furthermore, a spacer film 12 is formed to cover the first silicon film 11. This spacer film 12 is formed of for example a silicon oxide form deposited by a known CVD process. The reason for this is that, in a step for removing the spacer film 12, which will be conducted in a later stage, a substantial selective etching ratio is ensured between the spacer film 12 and the stopper film 7.

Thereafter, a patterned photoresist film 13 having a desired pattern is formed by depositing, exposing and developing a photoresist by use of a known photolithography.

Figure 1B:
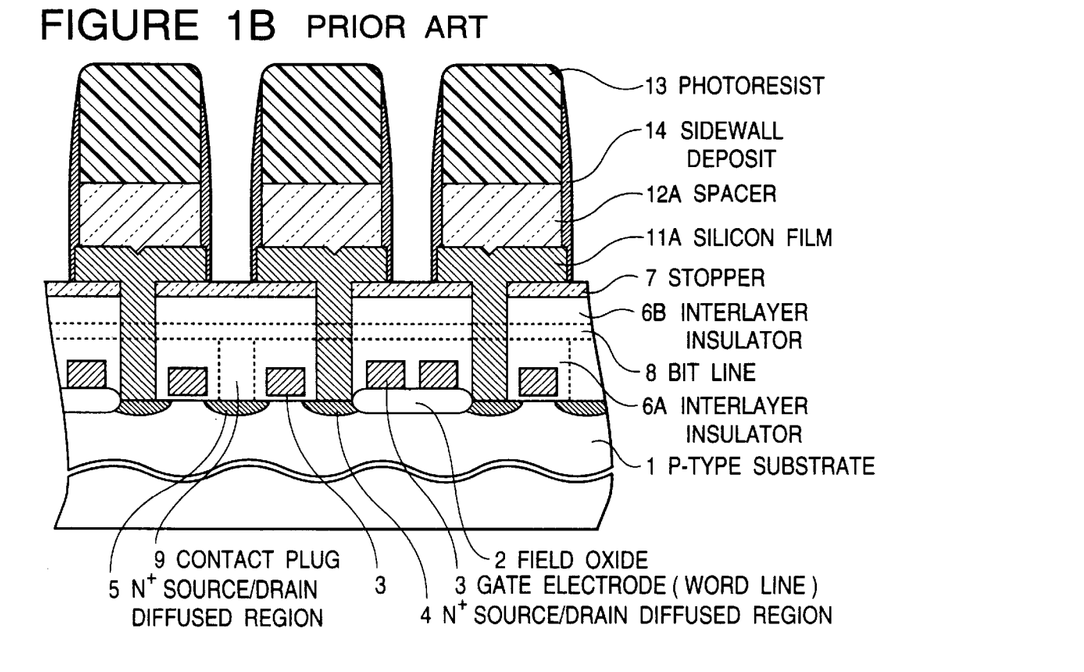

Then, an anisotropic dry etching is conducted by a known RIE (reactive ion etching) process, and by using the patterned photoresist film 13 as a mask, so that the spacer film 12 and the first silicon film 11 are patterned together, as shown in FIG. 1B. For example, this anisotropic dry etching is conducted as follows: First, the spacer film 12 formed of silicon oxide is etched by using a mixed gas containing CF4 gas and CHF3 gas as main components, and succeedingly, the first silicon film 11 is etched by using a mixed gas containing Cl2 gas and HBr gas as main components. In the course of etching the spacer film 12, a deposit 14 formed of a fluorocarbon polymer is deposited on a sidewall of the patterned spacer film 12, with progress of the etching and simultaneously as the sidewall itself is formed by the etching. This sidewall deposit 14 prevents advance of a sidewall etching of the patterned spacer film 12, with the result that the anisotropic etching becomes possible. This sidewall deposit 14 has a thickness on the order of 10 nm to 20 nm. Since the silicon film 11 is etched by using the mask including the thickness of the deposit 14, a patterned silicon film 11A becomes different in size from a patterned spacer film 12A.

Figure 1C:
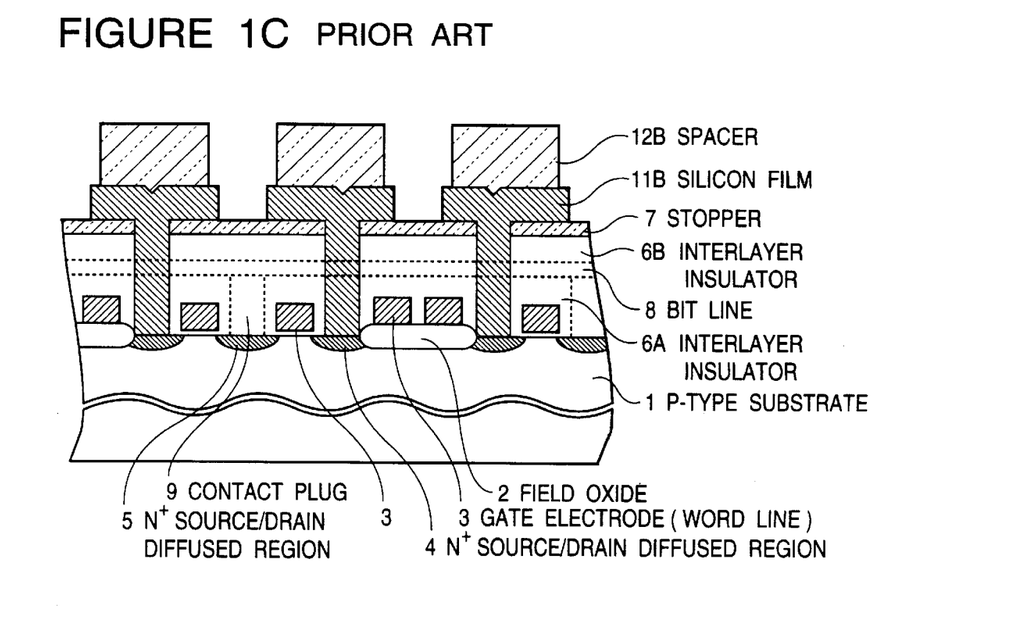

Next, as shown in FIG. 1C, the photoresist film 13 is removed. In the process for removing the photoresist film 13, however, not only the photoresist film 13 and the deposit 14 are removed, but also the patterned silicon film 11A and the patterned spacer film 12A are etched with a thickness of 1 nm to 2 nm and a thickness of 10 nm to 30 nm, respectively, with the result that an enlarged difference in size occurs between a patterned silicon film 11B and a patterned spacer 12B.

Figure 1D:
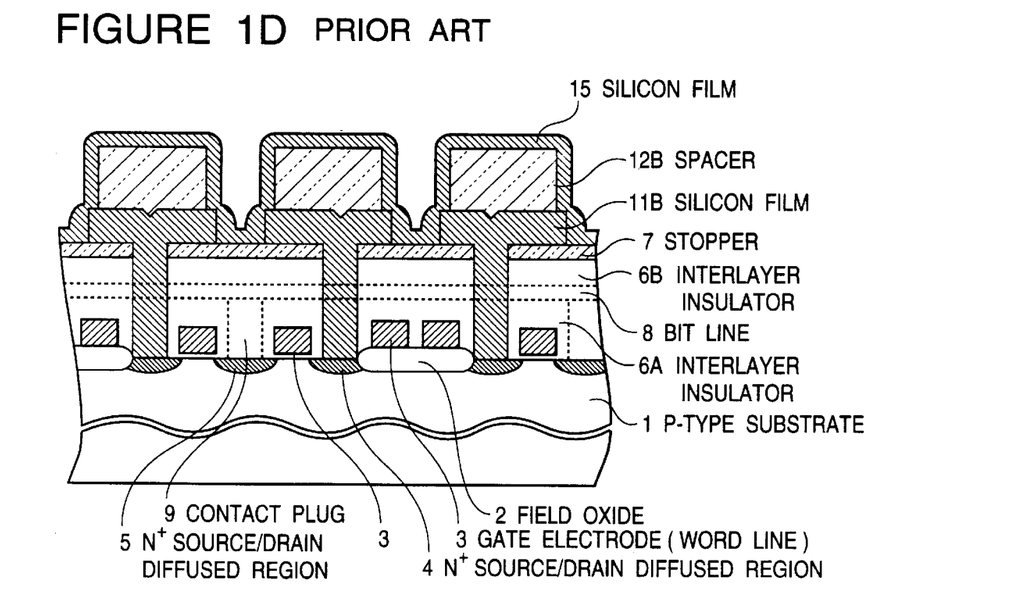

Then, as shown in FIG. 1D, a second silicon film 15 is deposited to cover the whole surface by the CVD process.

Figure 1E:
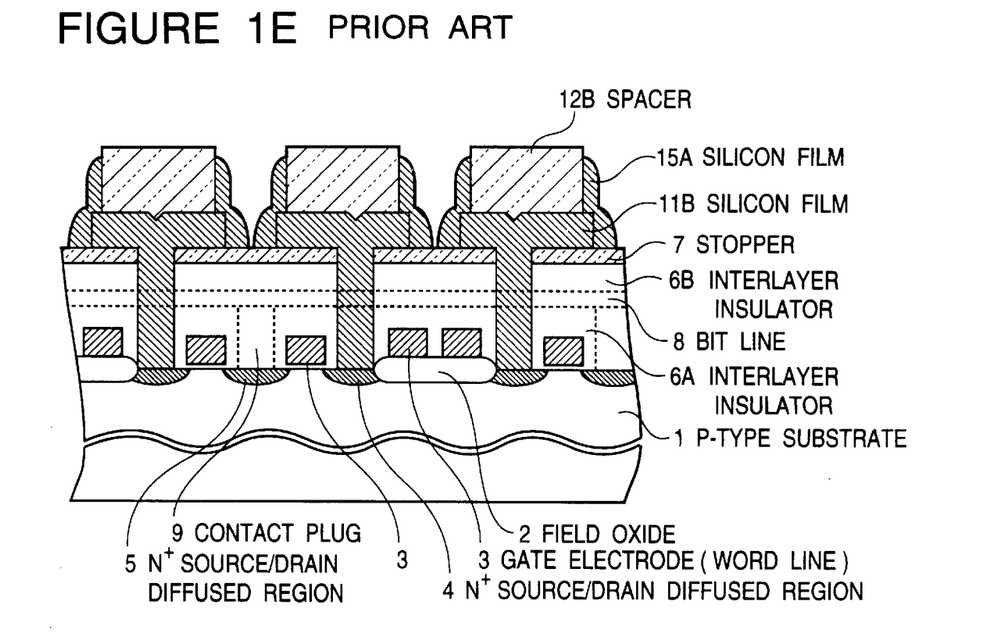

Furthermore, as shown in FIG. 1E, an anisotropic dry etching is conducted by a known RIE process, so that a sidewall 15A of the second silicon film is left to cover a side surface of the patterned spacer 12B and the patterned silicon film 11B. For example, this anisotropic dry etching is conducted by using a mixed gas containing Cl2 and HBr as main components.

Figure 1F:
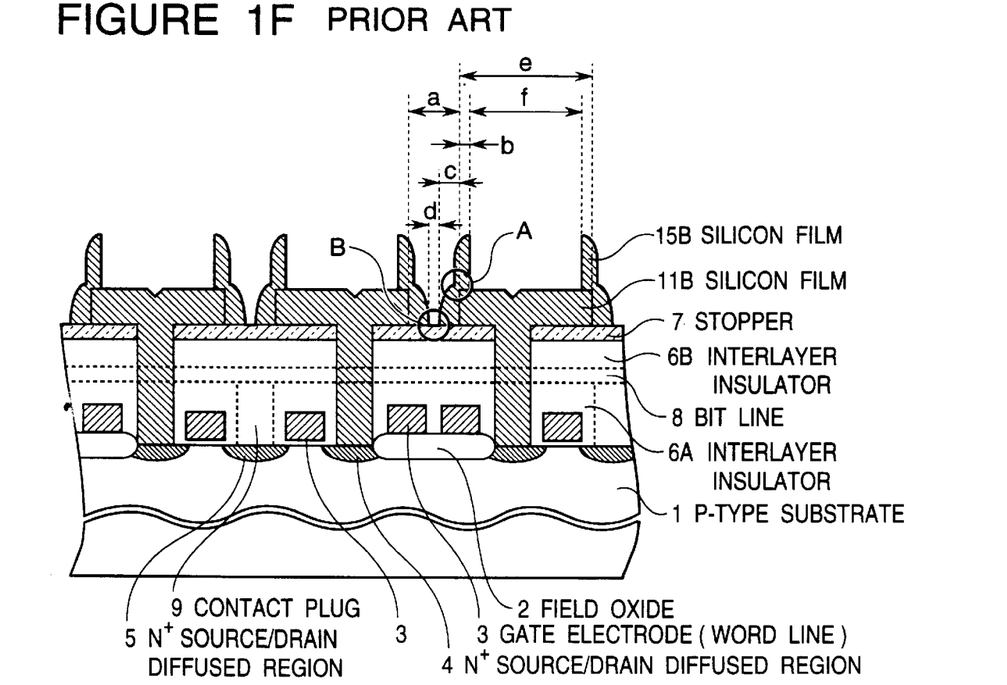

Thereafter, as shown in FIG. 1F, the patterned spacer 12B is selectively removed by a hydrogen fluoride aqueous solution. Then, impurity such as arsenic or phosphorus is introduced into the patterned first silicon film 11B and the patterned second silicon film 15B in order to elevate conductivity of these films. Thus, a capacitor information storage plate (formed of a lower plate composed of a base 11B and a sidewall 15B) is finished. Thereafter, a dielectric film (not shown) is deposited, and an opposing plate (also not shown) is formed, so that the capacitor is completed.

In the above mentioned prior art process, however, since the first silicon film 11 is patterned after the spacer film 12A is patterned but before the photoresist film 13 and the deposit 14 are removed, the difference in size occurs between the spacer film 12A and the first silicon film 11A as shown in FIG. 1B, and then, in the step for removing the photoresist film 13, the difference in size between the spacer film 12B and the first silicon film 11B becomes large.

If this difference in size, designated by Reference Sign "b" in FIG. 1F, is large, a mechanical strength in a portion enclosed by a circle "A" in FIG. 1F becomes insufficient, so that the portion "A" is broken or destroyed in a washing step, with the result that a yield of production also drops.

In order to avoid the above mentioned problem, if a film thickness "c" of the second silicon film 15 is increased, a distance "d" between adjacent information storage plates becomes small, so that a short-circuit becomes easy to occur in a portion "B" in FIG. 1F. In this case, a yield of production drops.

Accordingly, it may be considered to increase the film thickness "c" of the second silicon film 15 and also to increase the distance "d" between adjacent information storage plates. However, from a viewpoint of design, a pitch "a+e" of the information storage plates is required to be maintained at a constant value. In addition, since there is a relation of a=2c+d in FIG. 1F, it is necessary to reduce "e" in order to increase the film thickness "c" and the distance "d" while maintaining the pitch "a+e" at the constant value. Here, "e" is a diameter of the patterned first silicon film 11B, and "a" is a distance or spacing between adjacent patterned first silicon films 11B. If the diameter "e" is reduced, the information storage plate becomes small as a whole, so that it becomes not possible to effectively increase a surface area of the information storage plate.

Furthermore, in order to suppress the size difference "b" between between tie spacer film 12B and the first silicon film 11B (the base of the capacitor lower plate), the stopper film and the spacer film must be formed of a material having a small amount of etching subjected to in the photoresist removing step and the washing step. Accordingly, the degree of freedom in selection of material is limited.

Figure 2:
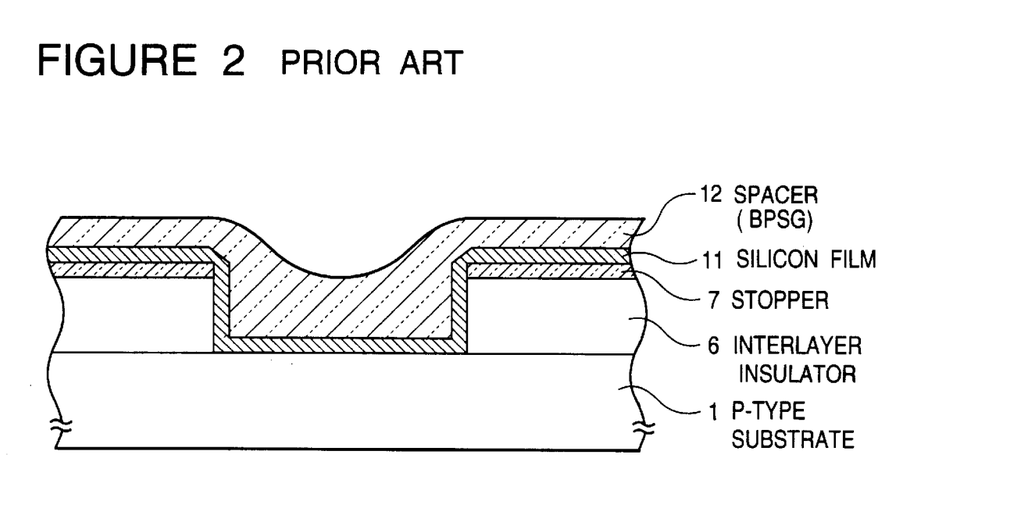
FIG. 2 is a diagrammatic sectional view of a portion of a semiconductor device, for illustrating a BPSG film having a good reflow shape in a step portion.
Figure 3:
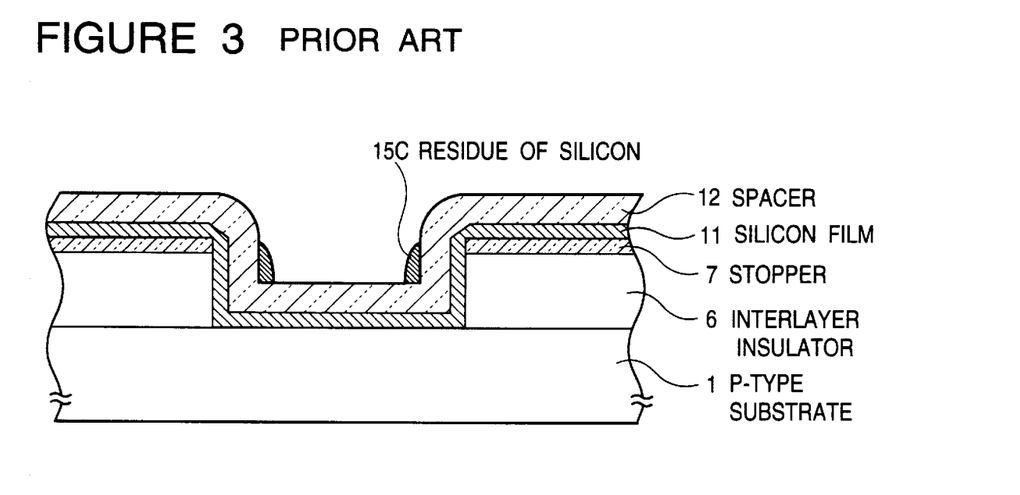
FIG. 3 is a diagrammatic sectional view of a portion of a semiconductor device, for illustrating a residue of silicon in a concave portion.

For example, it is known that, a BPSG (borophosphosilicate glass) film can have a good reflow shape in a step portion as shown in FIG. 2, if a heat treatment is conducted at a temperature of not less than 800° C. In FIG. 2, elements corresponding to those shown in FIGS. 1A to 1F are given the same Reference Numerals, and therefore, explanation thereof will be omitted. In the example shown in FIG. 2, the spacer film 12 is formed of BPSG. Accordingly, it is possible to prevent a residue of silicon which is apt to occur in the step at the time of etching back the second silicon film. If a good reflow shape cannot be obtained in the step in a region, such as a peripheral circuit region, other than a memory cell region, a residue 15C of silicon occurs as shown in FIG. 3, in which elements corresponding to those shown in FIG. 2 are given the same Reference Numerals, and therefore, explanation thereof will be omitted. As a result, when the spacer film is etch-removed by a hydrogen fluoride aqueous solution, the residue 15C of silicon, namely, a minute piece of silicon is peeled off. This is a cause of generation of so-called particles, which directly results in a lowered yield of production. Accordingly, use of the BPSG film as the spacer film may be considered to be effective in elevating the yield of production.

However, the BPSG film has a large amount of etching subjected to in the photoresist removing step and the washing step, and therefore, if the spacer film is formed of the BPSG film, the size difference "b" between the patterned spacer film and the patterned first silicon film is further increased. Because of this, it is difficult to use the RPSG film in the prior art.

SUMMARY OF THE INVENTION

Accordingly, it is an object of the present invention to provide an improved method for manufacturing a semiconductor device having a cylinder type stacked structure capacitor, which has overcome the above mentioned defect of the prior art one.

Another object of the present invention is to provide an improved method for forming a lower plate of a cylinder type stacked structure capacitor in a semiconductor device, with a minimized difference in size between a spacer film and a base of a capacitor lower plate, to avoid shortage in a mechanical strength, and to be able to effectively increase the capacitance of the capacitor with a high yield of production.

Still another object of the present invention is to provide an improved method for forming a lower plate of a cylinder type stacked structure capacitor in a semiconductor device, capable of using a material which was difficult to use in the prior art because the amount of etching subjected to in the photoresist removing step and the washing step was large, so that the degree of freedom in selecting the material for the spacer film and the stopper film is elevated, and a process design having a high yield of production becomes possible.

The above and other objects of the present invention are achieved in accordance with the present invention by a method for forming a lower plate of a cylinder type stacked structure capacitor in a semiconductor device, comprising the steps of:

depositing a first insulating film on a principal surface of a semiconductor substrate in which at least one MOS transistor is formed;

forming a contact hole which penetrates the first insulating film to reaches the semiconductor substrate;

depositing a first conducting film to full the contact hole and to cover the first insulating film;

depositing on the first conducting film a second insulating film which can be selectively etched against the first insulating film;

forming a resist film on the second insulating film and at a position directly above the contact hole;

conducting a first anisotropic etching using the resist film as a mask, so as to selectively etch the second insulating film, thereby to form a patterned second insulating film in alignment with the resist film;

removing the reaction product deposited and the resist film;

etching selectively the first conducting film using the patterned second insulating film as a mask, to form a patterned first conducting film in alignment with the patterned second insulating film, and to expose the first insulating film;

depositing a second conducting film on a whole surface;

conducting a second anisotropic etching to the second conducting film so that a remaining second conducting film is left only on a side surface of the patterned second insulating film and the patterned first conducting film thereunder, the remaining second conducting film being contacted with the patterned first conducting film; and selectively removing the patterned second insulating film, whereby the patterned first conducting film constitutes a base portion of a cylindrical capacitor lower plate, and the remaining second conducting film constitutes a sidewall portion of the cylindrical capacitor lower plate, the sidewall portion being upright from a periphery of the base portion.

In an embodiment, each of the first conducting film and the second conducting film can be formed of a polysilicon film or an amorphous silicon film. The first anisotropic etching can be conducted by a reactive ion etching using a mixed gas containing CF4 gas and CHF3 gas.

The second insulating film can be formed of a silicon oxide film. Alternatively, the first insulating film can be formed of a silicon nitride film, and the second insulating film can be formed of a silicon oxide film.

Furthermore, the first insulating film can be formed of a silicon nitride film, and the second insulating film can be formed of a silicon oxide film containing an impurity selected from the group consisting of V-group elements and III-group elements. Alternatively, the first insulating film can be formed of an undoped silicon oxide film, and the second insulating film can be formed of a silicon oxide film containing an impurity selected from the group consisting of V-group elements and III-group elements. In these cases, phosphorus can be selected from the V-group elements and boron can be selected from the III-group elements.

Moreover, after the second insulating film is formed of a silicon oxide film containing an impurity selected from the group consisting of V-group elements and III-group elements, a heat treatment can be conducted. Furthermore, after the first insulating film is formed of an undoped silicon oxide film, a heat treatment can be conducted.

When the second insulating film is formed of a silicon oxide film containing an impurity selected from the group consisting of V-group elements and III-group elements, the patterned second insulating film can be removed by an etching agent selected from the group consisting of a heated phosphoric acid aqueous solution and a hydrogen fluoride aqueous solution.

Preferably, the method can further includes the step of forming concavities and convexities on a surface of the cylindrical capacitor lower plate constituted of the patterned first conducting film and the remaining second conducting film.

With the above mentioned arrangement, since the first conducting film is patterned using the patterned second insulating film (spacer film) as the mask after the photoresist film is removed, it is possible to minimize the difference in size between the patterned spacer film and the patterned first conducting film, which constitutes the base portion of the capacitor lower plate.

The above and other objects, features and advantages of the present invention will be apparent from the following description of preferred embodiments of the invention with reference to the accompanying drawings.

DESCRIPTION OF THE PREFERRED EMBODIMENTS

Now, a first embodiment of the process in accordance with the present invention for forming a lower plate of the cylinder type stacked structure capacitor will be described with reference to FIGS. 4A to 4G, in which elements corresponding to those shown in FIGS. 1A to 1F are given the same Reference Numerals.

Figure 4A:
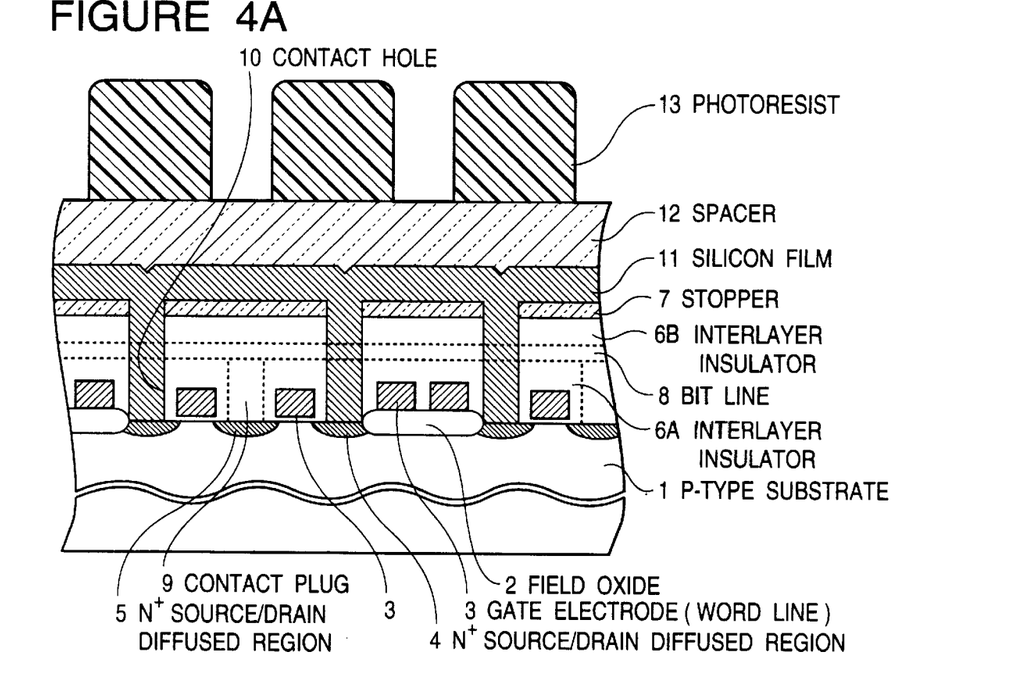
FIGS. 4A to 4G are diagrammatic sectional views of a portion of a semiconductor device, for illustrating one embodiment of the process in accordance with the present invention for forming a lower plate of the cylinder type stacked structure capacitor.

As shown in FIG. 4A, a field oxide film 2 is formed as a device isolation insulating film on a principal surface of a P-type silicon substrate 1, so as to define or confine a device formation region for a MOS transistor of a memory cell. And, a gate oxide film is formed to cover the principal surface of the P-type silicon substrate 1. For each memory cell transistor, a gate electrode 3 (functioning as a word line) of each MOS transistor is formed on the gate oxide film, and a pair of $N^+$ source/drain diffused regions 4 and 5 are formed in a principal surface region of the substrate 1. The diffused region 4 is to be connected to a possible capacitor, and the diffused region 5 is to be connected to a bit line. A silicon oxide film is deposited to form an interlayer insulator film 6A covering the gate electrode (word line) 3, and a bit line contact plug 9 is formed to penetrate through the interlayer insulator film 6A to reach the diffused region 5 for the bit line. A bit line 8 is formed on the interlayer insulator film 6A and to be electrically connected to the bit line contact plug 9. Furthermore, an interlayer insulator film 6B is also deposited to cover the bit line 8 and the interlayer insulator film 6A.

Thereafter, a stopper film 7 is deposited to cover the interlayer insulator film 6B. This stopper film 7 is formed of for example a silicon nitride film.

Then, a contact hole 10 is formed to penetrate through the stopper film 7 and the interlayer insulator films 6A and 6B to reach the diffused region 4 for the possible capacitor, and a first silicon film 11 (formed of an impurity-undoped polysilicon film having a thickness of about 100 nm to 300 nm) is deposited by a known CVD process to fill the contact hole 10 and to cover the stopper film 7. This first silicon film 11 constitutes a portion of an information storage plate (lower plate) of the possible capacitor. Furthermore, a spacer film 12 is formed to cover the first silicon film 11. This spacer film 12 is formed of for example a silicon oxide film having a thickness of about 400 nm to 500 nm deposited by a known CVD process. After the spacer film 12 is deposited, a heat treatment is conducted at a temperature of 800° C. to 900° C. for ten minutes to thirty minutes. This is to make the spacer film resistive to etching, in a step for removing a photoresist, which will be conducted in a later stage.

Thereafter, a patterned photoresist film 13 having a desired pattern is formed by depositing, exposing and developing a photoresist by use of a known photolithography.

Figure 4B:
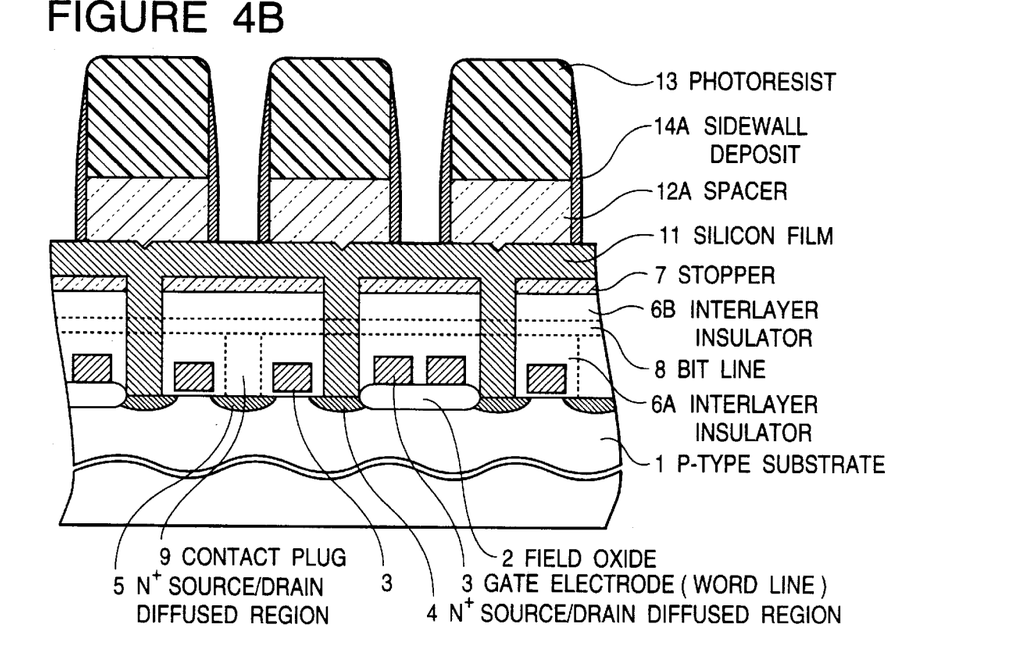

Then, an anisotropic dry etching is conducted by a known RIE process, and by using the patterned photoresist film 13 as a mask, so that only the spacer film 12 is patterned as shown in FIG. 4B. For example, this anisotropic dry etching is conducted by using a mixed gas containing CF4 and CHF3 as main components. With progress of the etching of the spacer film 12, a deposit 14A formed of a fluorocarbon polymer is simultaneously deposited on a side surface of the patterned photoresist film 13 and on a sidewall formed in the patterned spacer film 12A.

Figure 4C:
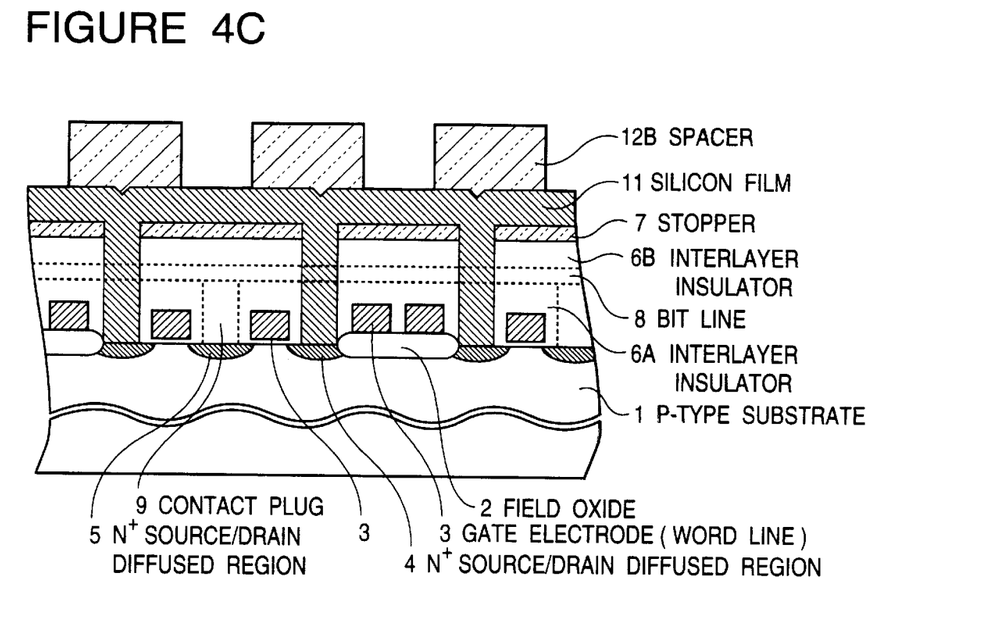
Figure 4D:
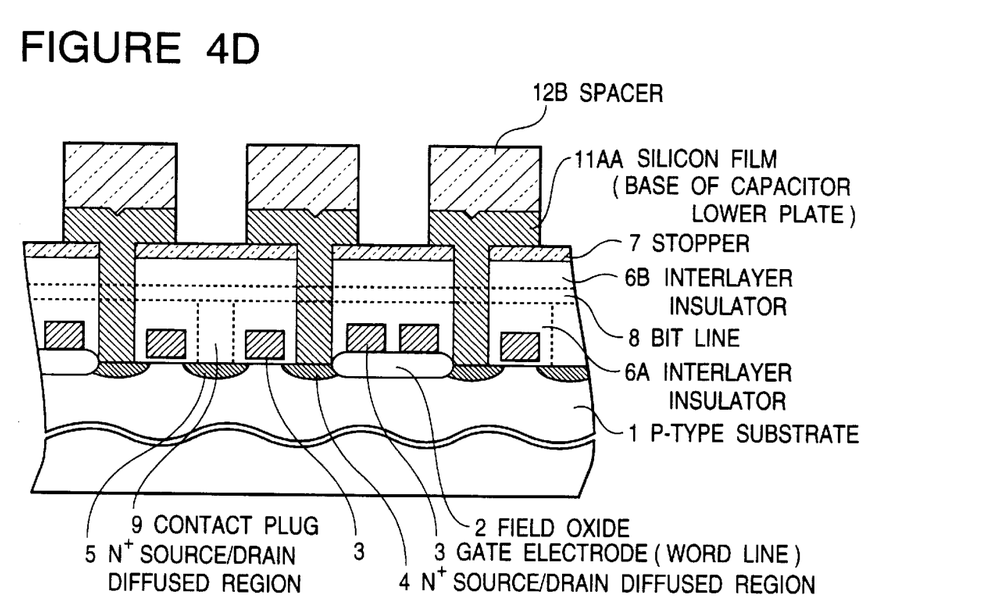

Next, as shown in FIG. 4C, the photoresist film 13 is removed. For this purpose, an ashing by an oxygen plasma and a treatment of a hot condensed sulfuric acid are ordinarily used. In this process for removing the photoresist film 13, the deposit 14A is removed simultaneously, and the patterned spacer film 12A is thinned by a thickness of 10 nm to 30 nm, with the result that a patterned spacer 12B as shown in FIG. 4C is obtained. This thinning of the patterned spacer film does not become inconvenient by determining the size of the photoresist film pattern by previously taking the amount of the thinning into consideration Then, as shown in FIG. 4D, the first silicon film 11 is etched by using a mixed gas containing Cl2 and HBr as main components and using the patterned spacer 12B as a mask. In this etching process, with progress of the etching, a reaction product $SiBr_x$ is deposited on the patterned spacer 11 and a sidewall of a formed patterned silicon film 11AA, with the result that the anisotropic etching becomes possible, similarly to the prior art example. However, a difference in size between the patterned spacer film 12B and the patterned silicon film 11AA (base of a lower electrode) does not occur almost, which would have occurred because of the deposit 14A formed at the time of patterning the spacer 12B and because of the process of removing the photoresist film.

Figure 4E:
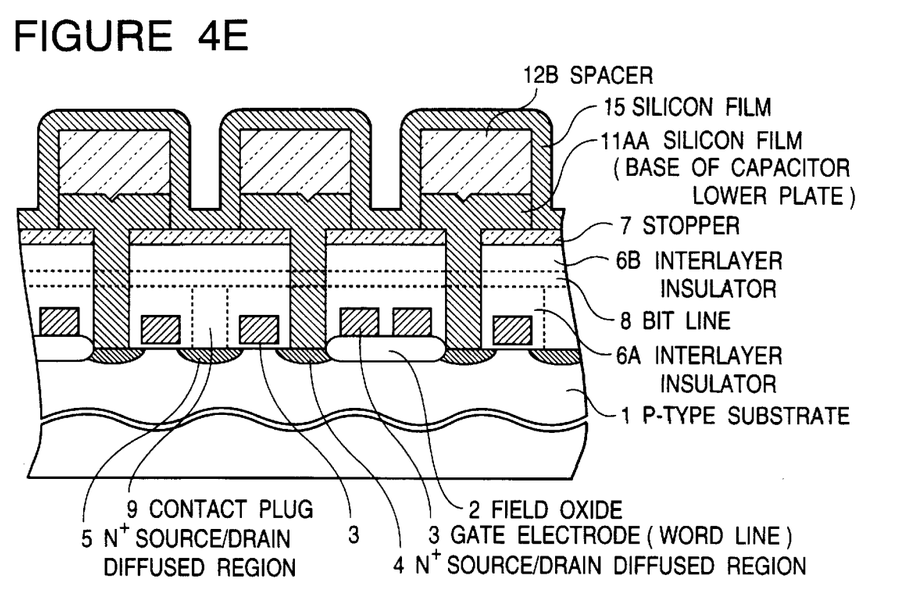

Next, as shown in FIG. 4E, a second silicon film 15 (formed of an undoped polysilicon film) is deposited by the CVD process to have a thickness of 150 nm and to cover the whole surface.

Figure 4F:
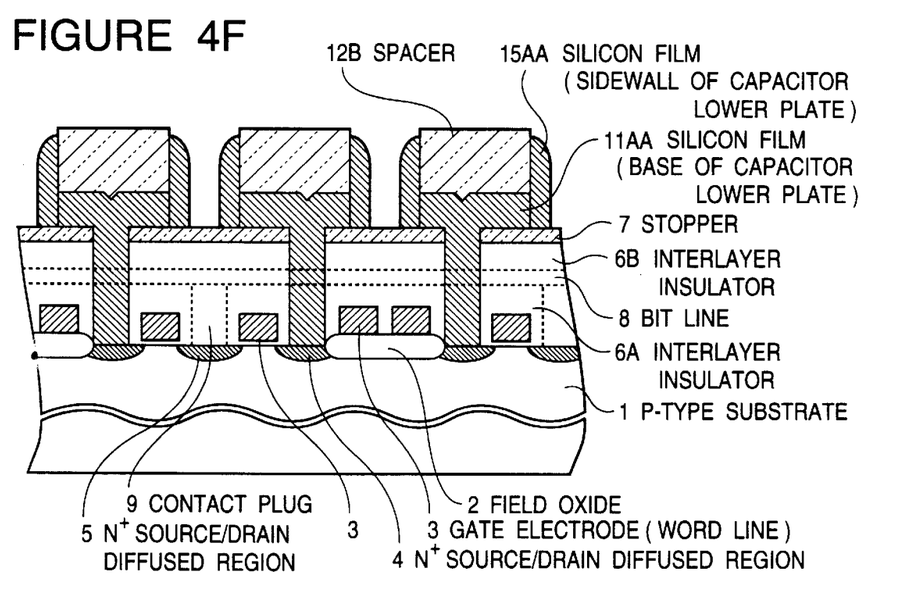

Furthermore, as shown in FIG. 4F, an anisotropic dry etching is conducted by a known RIE process, so that a sidewall 15AA of the second silicon film is left to cover a side surface of the patterned spacer 12B and the patterned silicon film 11AA. This sidewall 15AA constitutes a sidewall of the capacitor lower plate. For example, this anisotropic dry etching is conducted by using a mixed gas containing Cl2 and HBr as main components.

Thereafter, as shown in FIG. 1G, the patterned spacer 12B is selectively removed by a hydrogen fluoride aqueous solution. Then, impurity such as arsenic or phosphorus is introduced into the patterned first silicon film 11AA and the patterned second silicon film 15AA in order to elevate conductivity of these films. Thus, an information storage plate (formed of a lower plate composed of a base 11AA and a sidewall 15AA) of a capacitor is finished. Thereafter, as depicted in a dotted line in FIG. 4G, a dielectric film 18 is deposited, and an opposing conducting plate 19 is formed, so that the capacitor is completed.

In the above mentioned embodiment, at a last stage in the process of forming the information storage plate, impurity is simultaneously introduced into both the first and second silicon films. However, impurity may be introduced at each time and as the same time as each of the first and second silicon films is deposited.

Figure 4G:
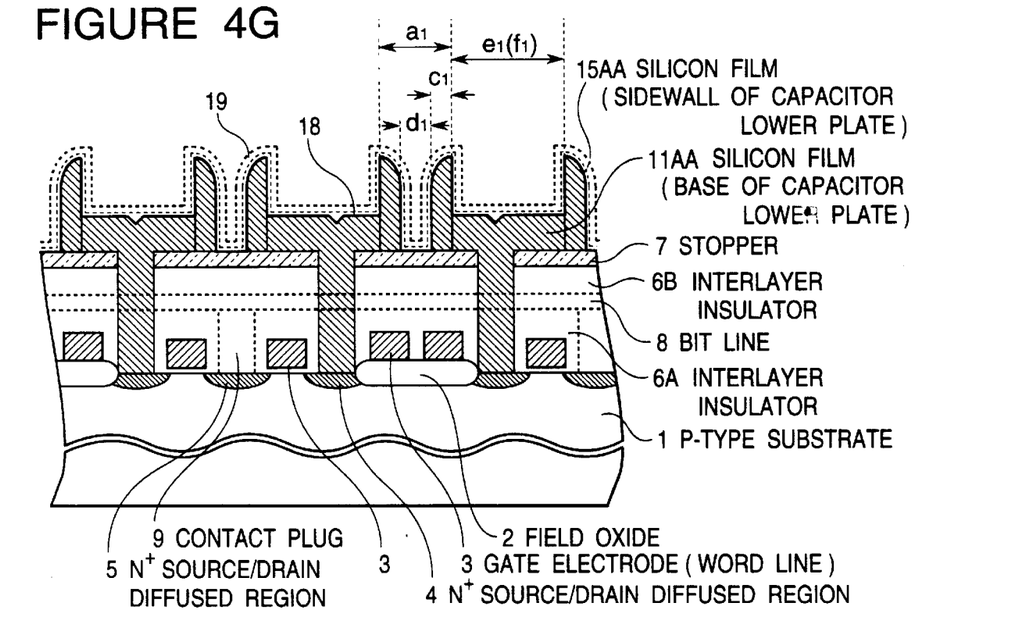

As seen from the above, an outer size or diameter "$e_1$" of the base 11AA of the capacitor lower plate and an inner size or diameter "$f_1$" of the sidewall 15AA of the same lower plate can be made substantially equal to each other. Accordingly, the sidewall of the lower plate can be prevented from becoming thin in the neighborhood of an edge of the base of the lower plate, with the result that the drop of the mechanical strength of the sidewall can be avoided. Therefore, it is no longer necessary to increase the thickness "$c_1$" of the sidewall, and accordingly, it is also no longer necessary to reduce the distance or spacing "$d_1$" between adjacent lower plates, with the result that possibility of a short-circuit between adjacent lower plates can be minimized. In addition, the drop of the yield of production caused by destruction of the sidewall can be prevented. Thus, it is possible to manufacture, with a high yield of production, a cylinder type stacked structure capacitor which can enlarge the capacitance of the stacked structure capacitor Now, a second embodiment of the process in accordance with the present invention for forming a lower plate of the cylinder type stacked structure capacitor will be described.

In the first embodiment, the stopper film is formed of the silicon nitride film and the spacer film is formed of the silicon oxide film. However, the spacer film can be formed of a BPSG (borophosphosilicate glass) which is a silicate glass containing a boron glass and a phosphorus glass. This BPSG film can be deposited by a know CVD process. For example, the concentration of boron is set to be 8 to 14 mol %, and the concentration of phosphorus is set to be 2 to 8 mol %. In addition, after the spacer film of BPSG is deposited, a heat treatment is conduced at a temperature of 800° C. to 900° C. for 10 minutes to 30 minutes. With this heat treatment, the spacer film becomes hard to etch in the process of removing the photoresist film 13, and also can have a reflow shape as mentioned below.

As mentioned hereinbefore, it is known that, a BPSG film can have a good reflow shape in a step portion if a heat treatment is conducted at a temperature of 800° C. to 900° C. Therefore, if the spacer film is formed of BPSG, it is possible to prevent a residue of silicon which is easy to occur in a step portion when the second silicon film is etched back. In the prior art example, since the photoresist is removed after both the spacer film and the first silicon film are patterned, if the spacer film is formed of BPSG, the spacer film is etched by a thickness of 20 nm to 20 nm in the process for removing the photoresist, with the result that a large difference in size inevitably occurs between the patterned spacer film and the patterned first silicon film. Therefore, it was not practical to use the BPSG in the prior art example.

In the present invention, on the other hand, as mentioned hereinbefore, since the first silicon film is patterned using the patterned spacer film as the mask after the photoresist film is removed, even if the spacer film is formed of BPSG, it is possible to minimize the difference in size between the patterned spacer film and the patterned first silicon film. In this connection, since the BPSG spacer film thinned because of the photoresist film removing process, namely the BPSG spacer film having a reduced size or diameter, is used as the mask, the first silicon film is also patterned to have a thinned shape, namely to have a reduced size or diameter. However, this does not become a problem, if the size of the photoresist mask is determined by previously taking the thinning of the BPSG film into consideration.

Now, a third embodiment of the process in accordance with the present invention for forming a lower plate of the cylinder type stacked structure capacitor will be described.

The BPSG is lower in chemical resistivity than an NSG (non-doped silicate glass having no impurity). Therefore, an etching rate of the BPSG is high. Therefore, if the stopper film is formed of NSG, it is possible to selectively remove the BPSG spacer film by use of a heated phosphoric acid aqueous solution or a hydrogen fluoride aqueous solution. On the other hand, if the NSG film is heat-treated at a temperature of 800° C. to 900° C., the etching rate of the NSG lowers. Therefore, if the heat treatment is conducted after the deposition of the NSG stopper film, the selective etching ratio in the spacer film removing process can be increased.

The following advantages can be obtained when the stopper film is formed of NSG.

Since the silicon nitride film has a large stress, a crack often occurs in the silicon nitride film, which becomes a cause of a device defective. In addition, since the silicon nitride film is an insulating film having a high electric charge trapping density, a so called charge-up is easy to occur, which gives an adverse influence to an operation of the semiconductor device. Accordingly, generation of these faults can be prevented by changing the material of the stopper film from the silicon nitride to the BPSG.

Furthermore, it was confirmed that the spacer film can be formed of a PSG (phosphosilicate glass) which is a silicate glass containing a phosphorus glass.

In this case, the concentration of phosphorus in the PSG film is set to be not less than 8 mol % but not greater than 15 mol %. The larger the concentration of phosphorus is, it becomes easier to obtain a reflow shape, and the etching rate by the hydrogen fluoride aqueous solution or another becomes high. The selective etching ratio between the NSG stopper film and the PSG spacer film can be made large. However, if the concentration of phosphorus becomes greater than 15 mol %, the film quality deteriorates, and the surface becomes cloudy because of separating. Therefore, preferably, the concentration of phosphorus in the PSG film is set to be in a range of 10 mol % to 13 mol %.

Alternatively, as the spacer film, it is possible to use ASG (silicate glass containing an arsenic glass), GSG (silicate glass containing a germanium glass), BSG (silicate glass containing a boron glass), or a silicate glass containing a V-group element, or a III-group element, or both.

In the above mentioned embodiments, each of the first and second silicon films was described to be formed of a polysilicon, but can be formed of amorphous silicon film. Furthermore, it is possible to use a barrier film formed of $TiN_x$. If a heat treatment is conducted at a temperature of 600° C. to 800° C., the amorphous silicon film becomes a polysilicon film. Therefore, if each of the first and second silicon films is formed of amorphous silicon film, after the second silicon film is deposited, it is sufficient if this conversion is conducted before or after the anisotropic etching.

Figure 5:
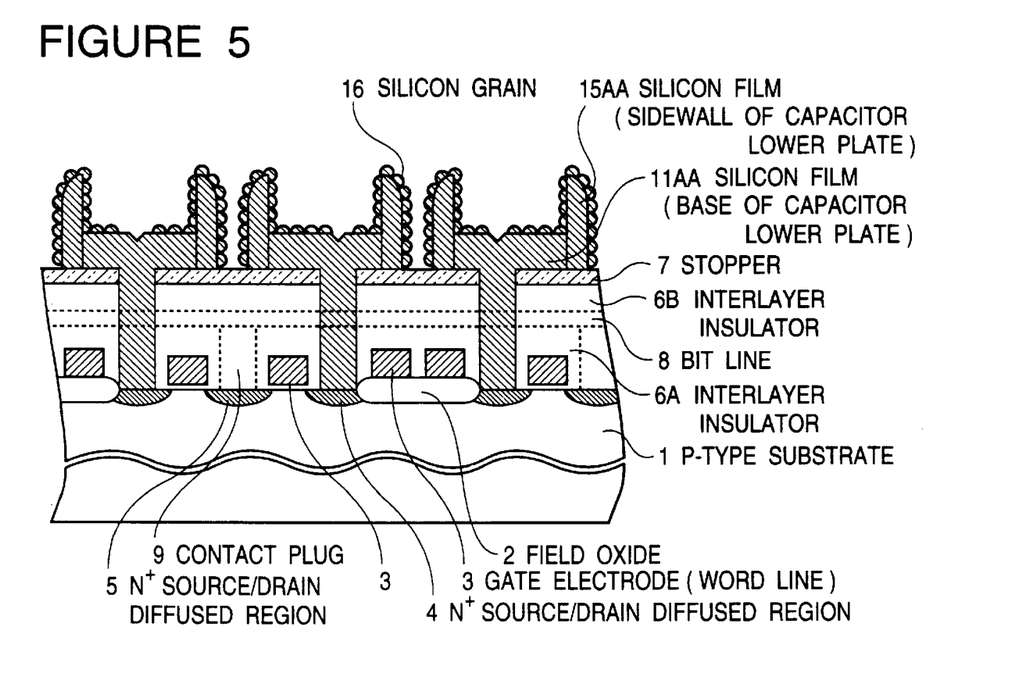
FIG. 5 is a diagrammatic sectional view of a portion of a semiconductor device, for illustrating a modification of the process in accordance with the present invention.

In addition, after the cylindrical information storage plate (lower plate) of the capacitor is formed, it is possible to form a number of hemispherical silicon crystalline grains (HSG) 16 on a surface of the cylindrical information storage plate by a known process as shown in FIG. 5, to form a number of concavities and convexities on the plate surface so that a surface area is increased. In particular, in a method of forming minute crystal nucleus on the amorphous silicon surface so as to form the hemispherical silicon crystalline grains (HSG) by use of a surface migration of silicon, a crystalline grain grows or upheaves by consuming a silicon from an underlying amorphous silicon, so that the underlying amorphous silicon film becomes thin. In this case, therefore, a mechanical strength of the cylindrical portion of the information storage plate is required. Accordingly, the present invention is effective in this application.

As seen from the above, the method in accordance with the present invention is characterized in that a first anisotropic etching is conducted to a second insulating film formed on a first conducting film, using a patterned resist film as a mask, so as to form a patterned spacer, and then, after the resist film is removed, the first conducting film is patterned using the patterned spacer film as a mask, so as to form a base portion of a capacitor lower plate (a first portion of the capacitor lower plate). Therefore, it is possible to minimize or nullify the difference in size between the patterned spacer film and the base portion of the capacitor lower plate. Accordingly, a sidewall of the capacitor lower plate, which uprightly stands from a periphery of the base portion of the capacitor lower plate, is prevented from becoming thin in the neighborhood of an edge of the base of the lower plate, with the result that the drop of the mechanical strength of the sidewall can be avoided, and destruction of the sidewall can be prevented, which would otherwise have occurred in the prior art semiconductor device manufacturing process. In addition, it is no longer necessary to increase the thickness of the sidewall to the purpose of compensating for shortage of the mechanical strength, and therefore, possibility of a short-circuit between adjacent lower plates can be minimized.

In addition, the spacer can be formed of a material, such as BPSG and PBG, which has an excellent reflow property but which was difficult to use in the prior art because it has a large amount of etching subjected to in the resist film removing process and in the washing process. Therefore, it it possible to make zero the residue of a second conducting film in a step portion, so that it is possible to prevent generation of residue which had occurred at the time of removing the spacer film in the prior art method.

Furthermore, since it is possible to use an insulating material having a large etching rate for the second insulting film for constituting the spacer, it is possible to use a NSG film as the stopper film. Therefore, it is possible to avoid crack of the stopper film and an adverse influence to a device operation such as a charge-up, which were generated in the prior art because the stopper film is formed of silicon nitride.

Thus, it is possible to manufacture, with a high yield of production, a cylinder type stacked structure capacitor having a high reliability.

The invention has thus been shown and described with reference to the specific embodiments. However, it should be noted that the present invention is in no way limited to the details of the illustrated structures but changes and modifications may be made within the scope of the appended claims.

We claim:

1. A method for forming a lower plate of a cylinder type stacked structure capacitor in a semiconductor device, comprising:

depositing a first insulating film on a principal surface of a semiconductor substrate in which at least one MOS transistor is formed;

forming a contact hole which penetrates said first insulating film to reach said semiconductor substrate;

depositing a first conducting film to fill said contact hole and to cover said first insulating film;

depositing on said first conducting film, a second insulating film which is formed of a silicon oxide film containing at least one impurity selected from the group consisting of V-group elements and III-group elements, and which can be selectively etched against said first insulating film;

conducting a heat treatment after said second insulating film is deposited;

forming a resist film on said second insulating film and at a position directly above said contact hole;

conducting a first anisotropic etching using said photoresist film as a mask, so as to selectively etch said second insulating film, thereby to deposit an etching reaction product and to form a patterned second insulating film in alignment with said resist film;

removing said reaction product deposited and said resist film;

etching selectively said first conducting film using said patterned film as a mask, to form a patterned first conducting film in alignment with said patterned second insulating film, and to expose said first insulating film;

depositing a second conducting film on a whole surface;

conducting a second anisotropic etching to said second conducting film so that a remaining second conducting film is left only on a side surface of said patterned second insulating film and said patterned first conducting film thereunder, said remaining second conducting film being in contact with said patterned first conducting film; and selectively removing said patterned second insulating film, whereby said patterned first conducting film constitutes a base portion of a cylindrical capacitor lower plate, and said remaining second conducting film constitutes a sidewall portion of said cylindrical capacitor lower plate, said sidewall portion being upright from a periphery of said base portion.

2. A method claimed in claim 1 wherein said first conducting film is formed of a silicon film.

3. A method claimed in claim 1 wherein said first anisotropic etching is conducted by a reactive ion etching using a mixed gas containing $CF_4$ gas and $CHF_3$ gas.

4. A method claimed in claim 1 wherein said first insulating film is formed of a silicon nitride film.

5. A method claimed in claim 4 wherein said second insulating film being formed of borophosphosilicate glass.

6. A method claimed in claim 4 wherein said second insulating film being formed of phosphosilicate glass.

7. A method claimed in claim 1 wherein said first insulating film is formed of an undoped silicon film.

8. A method as claimed in claim 7 wherein said second insulating film being formed of borophosphosilicate glass.

9. A method claimed in claim 7 wherein said second insulating film being formed of phosphosilicate glass.

10. A method claimed in claim 7 wherein a heat treatment is conducted after said first insulating film is deposited.

11. A method claimed in claim 1 wherein said patterned second insulating film is removed by an etching agent selected from the group consisting of a heated phosphoric acid aqueous solution and a hydrogen fluoride aqueous solution.

12. A method claimed in claim 1 further including the step of forming concavities and convexities on a surface of said cylindrical capacitor lower plate constituted of said patterned first conducting film and said remaining second conducting film.

* * * * *